US005298690A

United States Patent [19]

Klein

[11] Patent Number: 5,298,690

[45] Date of Patent: Mar. 29, 1994

[54] SOUND DISTRIBUTOR WITH SYMMETRY OF REVOLUTION

[75] Inventor: Siegfried Klein, Paris, France

[73] Assignee: Commissariat A L'Energie Atomique, France

[21] Appl. No.: 66,338

[22] Filed: May 21, 1993

Related U.S. Application Data

[63] Continuation of Ser. No. 785,490, Oct. 31, 1991, abandoned.

[30] Foreign Application Priority Data

Nov. 8, 1990 [FR] France ................................ 9013872

[51] Int. Cl.[5] ................................ H05K 5/00

[52] U.S. Cl. ................................ 181/152; 181/153; 181/155

[58] Field of Search ............... 181/144, 145, 146, 151, 181/152, 153, 154, 155, 156, 159, 163, 173, 191, 192, 199; 381/90, 160, 182, 184, 186

[56] References Cited

U.S. PATENT DOCUMENTS

| | | | |
|---|---|---|---|
| 2,956,636 | 10/1960 | Boersma | 181/155 |
| 3,649,776 | 3/1972 | Burton | 181/152 |
| 4,157,741 | 6/1979 | Goldwater | 181/159 |
| 4,496,021 | 1/1985 | Berlant | 181/152 |
| 5,115,882 | 5/1992 | Woody | 181/144 |

*Primary Examiner*—Michael L. Gellner
*Assistant Examiner*—Khanh Dang
*Attorney, Agent, or Firm*—Pearne, Gordon, McCoy & Granger

[57] ABSTRACT

The invention relates to a sound distributor with symmetry of revolution. The distributor comprises two sound reflecting cups, having a convex shape which is an exponential of surface revolution about a fictitious axis. The outer surfaces of these cups are arranged in tail to tail manner. The distributor has at least one sound source positioned facing a small opening of one of the cups. Around an opening in the bottom of the second cup, the distributor also has a trumpet-shaped reflector and a cone-shaped reflector for directing sound along the axis.

11 Claims, 3 Drawing Sheets

SOUND DISTRIBUTOR WITH SYMMETRY OF REVOLUTION

Figure 1:
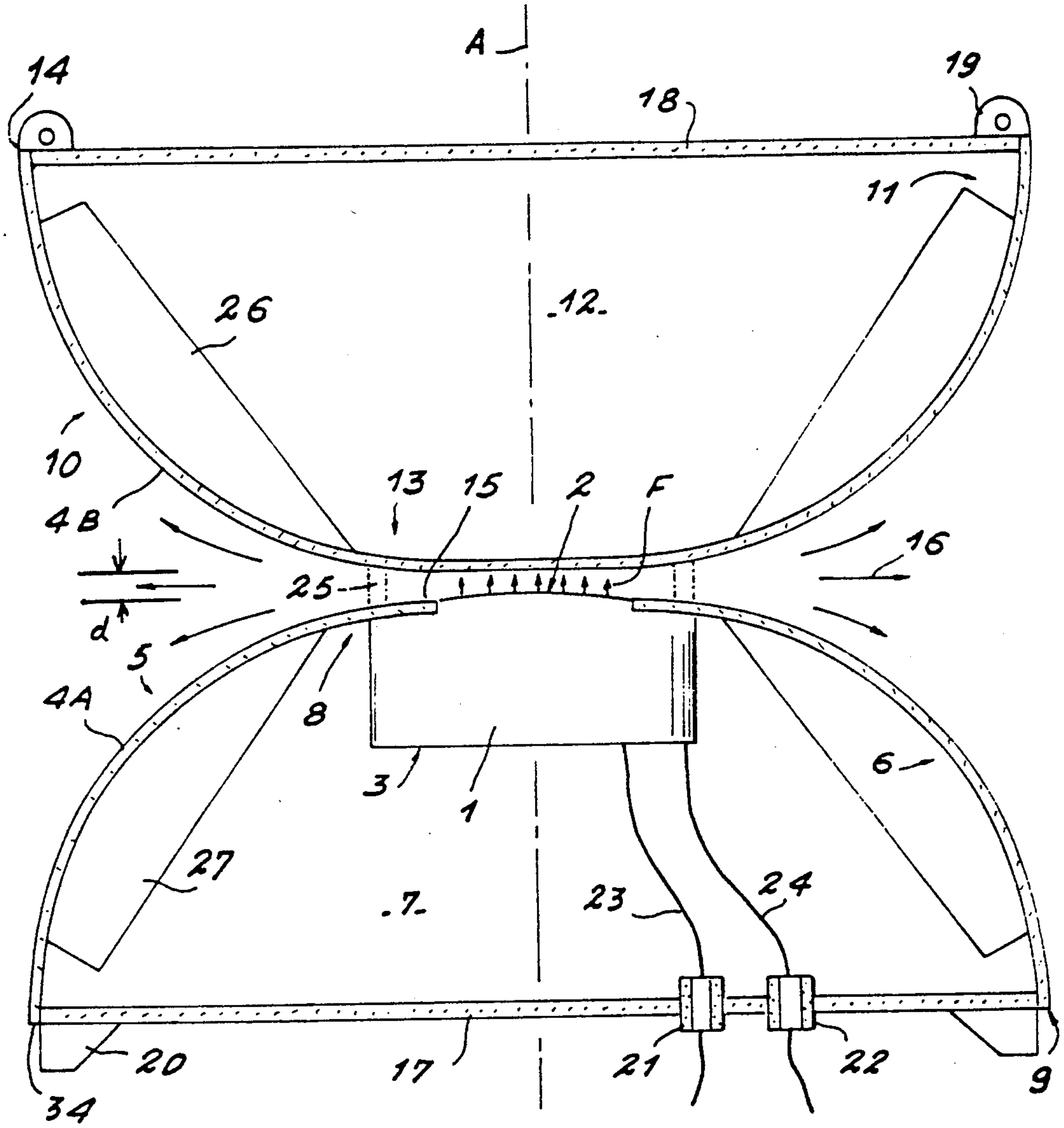
FIG. 1 PRIOR ART

This is a continuation of application Ser. No. 07/785490, filed Oct. 31, 1991, now abandoned.

DESCRIPTION

The present invention relates to an acoustic or sound distributor with symmetry of revolution with respect to a fictitious axis able to radiate sound from a sound source located on the axis, not only by 360° about said axis, in an annular volume centred in the vicinity of the source, but also along the said axis. The invention more particularly applies to the reproduction of sound in a frequency range corresponding to the high fidelity range.

At present there is no sound distributor having a simple, inexpensive construction, which is able to distribute sound from a sound source located on an axis, not only in an annular volume 360° around the said axis, but also along the latter.

A sound distributor is known, which is able to distribute sound from a sound source in an annular volume over 360° around a fictitious axis. This distributor is diagrammatically shown in axial section in FIG. 1.

It has a symmetry of revolution relative to a fictitious axis A and is able, as will be shown hereinafter, to radiate sound in an annular volume over 360° around the said axis, said annular volume being centred in the vicinity of the source. The distributor shown has at least one sound source 1 located on the axis A. This source has a front face 2 and a rear face 3. The sounds are transmitted by the front face 2 and irradiated in directions adjacent to the axis A, as illustrated by the arrows F.

The distributor also has a first and second cups 4A, 4B reflecting the sounds transmitted by the source 1. Each cup has a symmetry of revolution about the axis A and has a convex outer surface defining an external portion of the cup and an inner concave surface defining an inner portion of the cup. For the first cup 4A, the convex outer surface is shown at 5, whilst the inner surface is shown at 6. The inner surface defines an inner portion 7 of the first cup, which also has a bottom 8 and a large opening defined by a ledge 9.

The second cup 4B has a convex outer surface 10 and an inner surface 11 defining an inner portion 12 of said second cup. The latter also has a bottom 13 and a large opening defined by an edge 14.

The axis of these two cups are oriented along the fictitious axis A and coincide therewith. The two cups are positioned tail to tail, so that their convex surfaces 5, 10 face one another and their bottoms 8, 13 are spaced by a predetermined distance d, as will be shown hereinafter.

The bottom 8 of the first cup 4A has a small opening 15 centred on the axis A. The sound source 1 is positioned facing said opening, in such a way that the front face 2 of said source is located in the inner portion 7 of the first cup 4A.

Sounds are irradiated towards the outer surface 10 of the second cup 4B and are reflected away from the fictitious axis A" by the outer surfaces 5 and 10 of the two cups so as to be radiated, in the manner shown by arrow 16, in an annular volume around the axis A, i.e. by 360° about the said axis. This volume is centred on the axis A at a point thereof close to the source 1 and between the two cups.

The large opening of the two cups can be respectively closed by covers 17, 18. The cover 18 of the second cup 4B can be provided with rings 19 permitting the suspension of the distributor. In the same way, the cover 17 of the first cup 4A can be provided with feet 20 making it possible to place the distributor on a support.

The cover 17 can also have connecting terminals 21, 22 connected by conductors 23, 24 to the sound source 1. These terminals are e.g. connected to the output of an amplifier supplying electric signals corresponding to the sound to be radiated. The sound source 1 can e.g. be an electrodynamic loudspeaker.

The bottoms 8, 13 of the two cups are spaced by a predetermined distance d defined as a function of the desired acoustic pass band. This, the bottoms of the two cups define a sound compression chamber and the spacing d is chosen in such a way that said chamber makes it possible to obtain the best possible acoustic efficiency. Fixing and spacing pins for the two cups, such as the pin 25 not only make it possible to join these two cups together, but also to fix the spacing d.

The drawing also shows reinforcements 26, 27 for the cups, particularly when the latter are made from a rigid synthetic material, such as e.g. a plastic material. The two cups can obviously be made from metal.

A distributor of this type is described in EP-A-0 390 123. This type of distributor suffers from the essential disadvantages of only ensuring a sound distribution in an annular volume by 360° about the axis, with no distribution being ensured along the axis.

The object of the invention is to obviate these disadvantages, particularly by using an acoustic or sound distributor with symmetry of revolution able to distribute sound, not only in an annular volume by 360° about an axis, but also along the said axis, whilst maintaining a simple structure.

The invention therefore relates to a sound distributor with symmetry of revolution with respect to a fictitious axis comprising at least one first sound source located on the said axis, said sound source having a front face and a rear face, the sound being emitted by the front face and being irradiated in directions adjacent to the said axis; a first and a second cup for reflecting the sounds emitted by the source, each cup having a symmetry of revolution about the said axis and having a convex outer surface and an inner surface defining an inner portion of the cup, so that the cup has a bottom and a large opening defined by an edge the two cups being oriented in accordance with said axis and arranged tail to tail, so that their convex surfaces face one another and their bottoms are spaced by a predetermined distance, the bottom of the first cup having a small opening centred on the said axis, said first sound source being positioned facing said small opening of the first cup, so that its front face is located in the vicinity of said small opening of the first cup and its rear face is located in the inner portion of the first cup, the sound being irradiated towards the outer surface of the second cup and reflected away from the said axis by the outer surfaces of the two cups characterized in that the bottom of the second cup has a small opening centred on said axis, the second cup having in its inner portion a first trumpet-shaped sound reflector trumpet having a first opening and a second opening which is smaller than the first opening, one edge of the first opening of the trumpet bearing on the edge of the second cup and one edge of the second opening of the trumpet bearing on the inner face of the second cup, in the vicinity of the small opening of the second cup, the trumpet having an inner face with a convex surface shape which is an exponential surface of revolution about said axis, the second cup also having a second cone-shaped reflector with a convex outer surface which is an exponential surface of revolution about the said axis, said cone having a base and an apex, the apex being directed towards the large opening of the second cup and the base being positioned facing the small opening of the second cup, set back from said small opening, in the inner portion of the second cup, so that the sounds emitted by the first source are also reflected by the inner face of the trumpet and by the outer face of the cone and are radiated towards the large opening of the second cup.

According to a variant of this embodiment of the distributor according to the invention, the latter has a second sound source with a front face and a rear face, the sound being emitted by the front face of said second source and being irradiated in directions adjacent to said axis, the second source being positioned facing the small opening of the second cup and being placed between the base of the cone and said small opening, so that the front face of the second source is located in the vicinity of the small opening of the second cup and the rear face is located in the inner portion of the second cup, the sounds of the second source being radiated towards the outer surface of the first cup and reflected away from said axis on the outer surfaces of the two cups said sounds also being reflected by the outer face of the trumpet and by the outer face of the cone and are then radiated towards the large opening of the second cup.

According to an advantageous feature, the two cups are made from a rigid material able to reflect sound. According to another advantageous feature, the sound sources are of the electrodynamic type.

Finally, according to another feature, the outer surfaces of the two cups have an exponential shape.

The invention is described in greater detail hereinafter relative to non-limitative embodiments and the attached drawings, wherein show:

FIG. 1 is a longitudinal cross section of a prior art structure already described.

Figure 2:
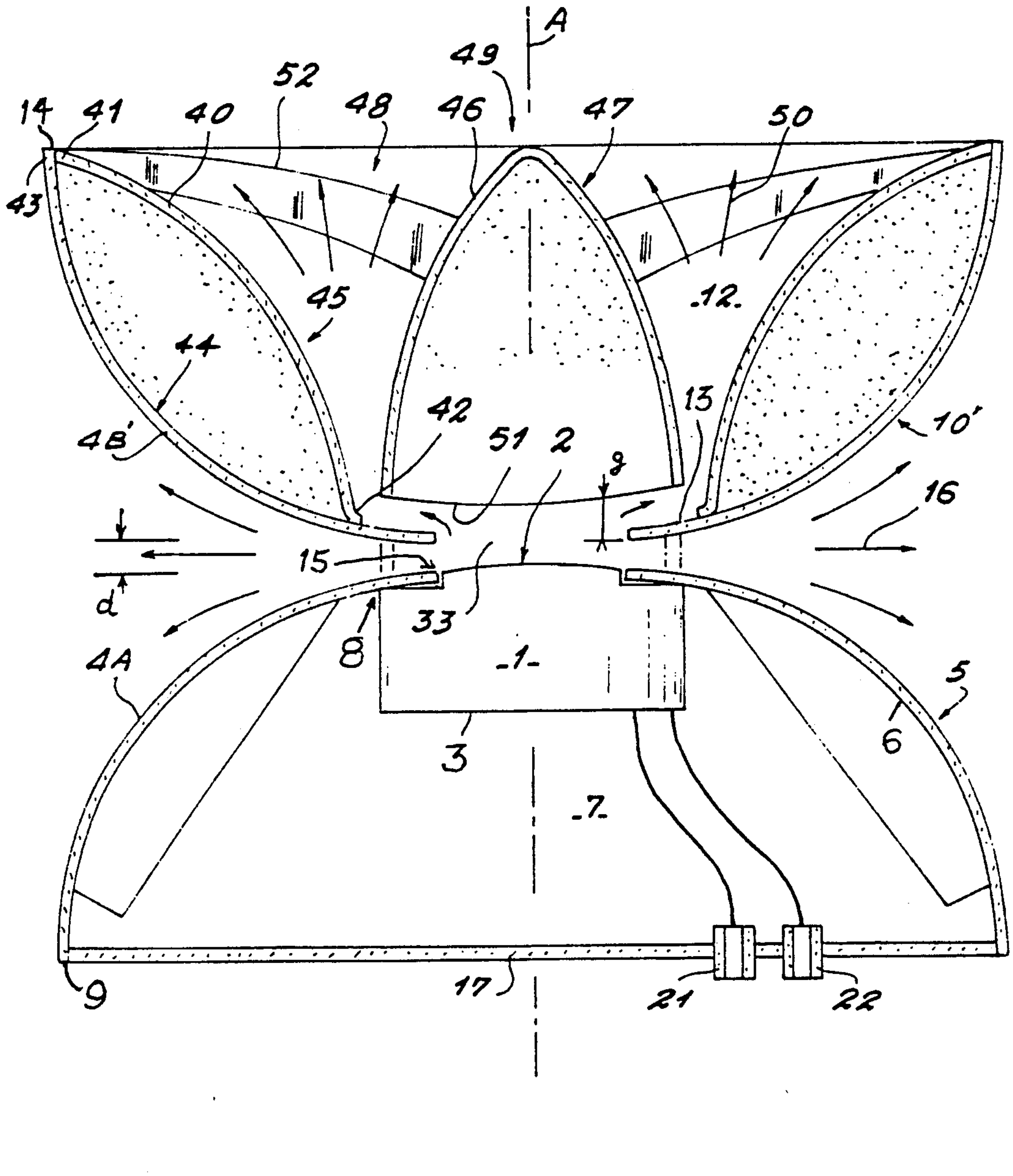

FIG. 2 Diagrammatically shows an axial section of a sound distributor according to an embodiment of the invention.

Figure 3:
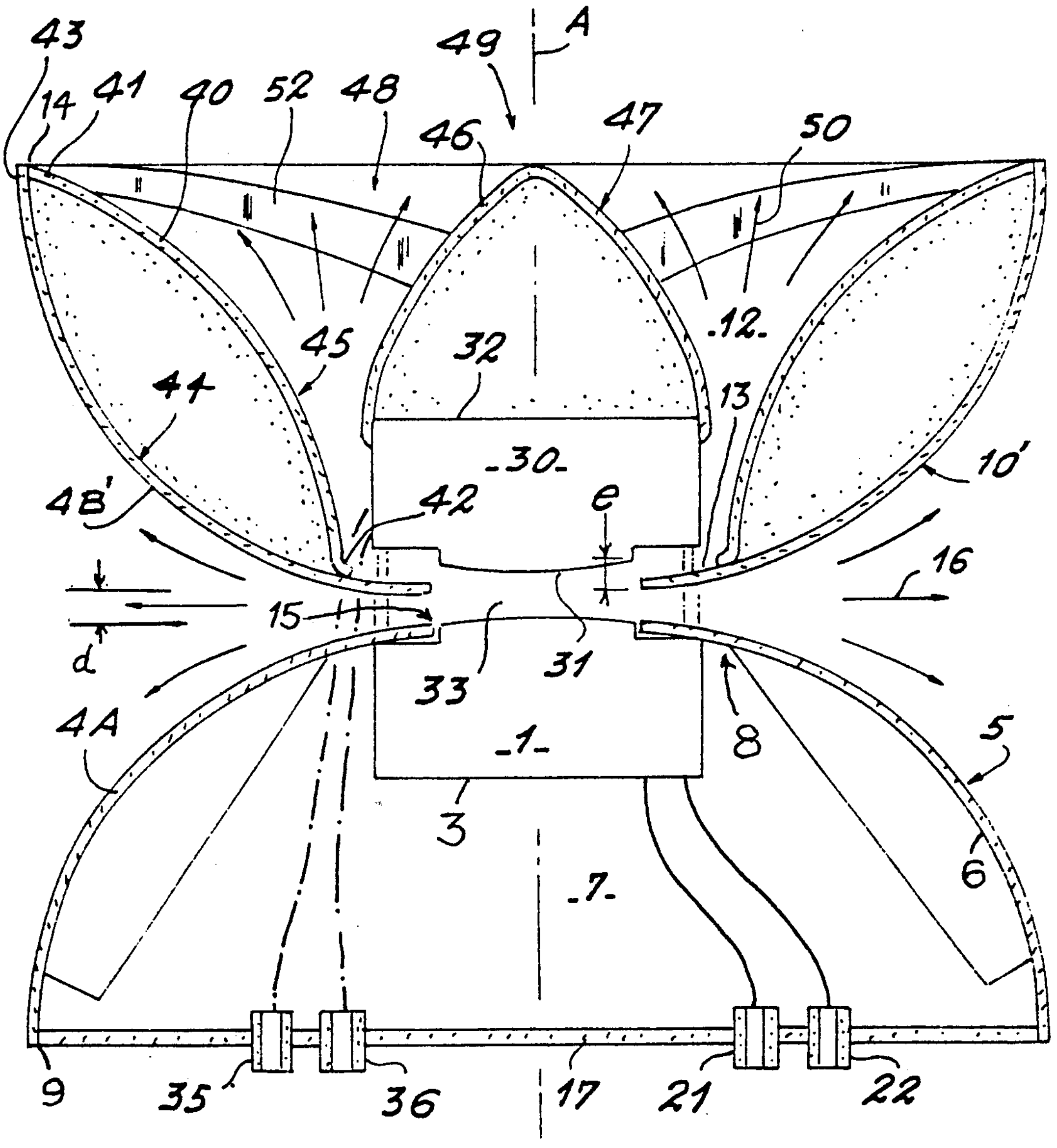

FIG. 3 Diagrammatically shows an axial section through a sound distributor according to a variant of the above embodiment.

FIG. 2 diagrammatically shows an axial section through a sound distributor according to an embodiment of the invention. The same elements carry the same references in FIG. 2 as in FIG. 1. In this embodiment, the convex surfaces 5 and 10 of the first and second cups 4A, 4B' are exponential surfaces of revolution about the fictitious axis A. The first cup 4A has in its inner portion 7 a first sound source 1. The distributor also has in the inner portion 12 of the second cup 4B', a first trumpet-shaped sound reflector trumpet 40. The latter has a first opening 41 and a second opening 42, which is smaller than the opening 41. One edge of the first opening 41 of the trumpet bears on the ledge 43 of the second cup, 4B' whilst one edge of the second opening 42 of the trumpet bears on the inner face 11 of the second cup, in the vicinity of a small opening 33 made in the bottom of said second cup. The trumpet 40 has an inner face 45 with a convex surface shape which is an exponential surface of revolution about the ficitious axis A.

This second cup also has a second cone-shaped reflector cone 46 with a convex outer surface 47 which is an exponential surface of revolution about the fictitious axis A. This nose cone has an apex 49 and a base 51. The apex 49 is directed towards the large opening 48 of the second cup. The base of the cone is positioned facing the small opening 33 of the second cup, set back by a distance g from said small opening, in the inner portion of the second cup.

Thus, the sound emitted by the front face 2 of the first source 1 is irradiated in accordance with the arrow 16 and also reflected by the inner face 45 of the trumpet 40 and by the outer face 47 of the cone, then being irradiated towards the large opening 48 of the second cup in accordance with the arrows 50. Spacers 52 integral with the nose cone 46 and the edge 43 of the second cup support the cone in said second cup.

A distributor according to this embodiment with the large first opening 41 of cup 4B' located on a horizontal plane consequently makes it possible to obtain a sound distribution in an annular volume around the fictitious axis A, as well as an upwardly directed sound distribution, as shown by the arrows 50. The cover 17 of the first cup 4A also has electric supply terminals of the first sound source 1.

Advantageously, the volume between the inner face 44 of the second cup and the trumpet 40 can be filled with a material preventing vibrations, e.g. glass wool.

FIG. 3 diagrammatically shows a variant of the distributor embodiment of FIG. 2. The same elements carry the same references as in the previous drawings.

In this variant, the convex surfaces 5 and 10 of the first and second cups 4A, 4B' are also exponential surfaces of revolution about the fictitious axis A.

As in the embodiment of FIG. 2, the first cup 4A is provided in its inner portion 7 with a first sound source 1 arranged in the same way as in the embodiment of FIG. 2. Here again the distributor has in the inner portion 12 of the second cup 4B' a first trumpet-shaped sound reflector trumpet 40, which has a first opening 41 and a second opening 42, which is smaller than the opening 41. An edge of the first opening 41 of the trumpet bears on the ledge 43 of the second cup, whilst an edge of the second opening 42 of the trumpet bears on the inner face 44 of the second cup, in the vicinity of the small opening 33 of said second cup. The trumpet 40 has an inner face 45 with a convex surface shape which is an exponential surface of revolution about the fictitious axis A.

In this variant, the distributor has a second sound source 30, whose front, sound-irradiating face, 31 is located in the vicinity of the small opening 33 of the second cup and with respect to which it has a spacing e. Thus, in this variant, the sound face 31 of the second source 30 is located in the inner portion 12 of the second cup 4B'.

This second cup also has a second, cone-shaped reflector cone 46, which has an outer convex surface 47 which is an exponential surface of revolution about the fictitious axis A. This nose cone extends between the rear face 32 of the second source 30 and the large opening 48 of the second cup. This cone has an apex 49 directed along the fictitious axis A towards the large opening 48 of the second cup.

As a result the sounds emitted by the front face 31 of the second source 30 are reflected by the outer face 5 of the first cup and also by the inner face 45 of the trumpet 40 and by the outer face 47 of the cone and are then radiated towards the large opening 48 of the second cup in accordance with the arrow 50. This also applies with regards to the sounds emitted by the first source 1, which are reflected by the outer surface 10 of the first cup, by the inner surface of the trumpet and by the outer surface of the cone. Spacers 52 integral with the nose cone 46 and the edge 43 of the second cup support the cone and the second sound source 30 in said second cup.

A distributor according to this variant with the large first opening 41 of cup 4B' located in a horizontal plane consequently makes it possible to obtain a sound distribution in an annular volume about the fictitious axis A, as well as an upwardly directed sound distribution, as illustrated by the arrows 50. The cover 17 of the first cup 4A, which has the electric supply terminals of the first sound source 1, can also have two other supply terminals 35, 36 for the second sound source 30 of FIG. 1. The two sound sources are supplied by in-phase signals.

Advantageously, the volume between the inner face 44 of the second cup and the trumpet 40 can be filled with a vibration-preventing material, e.g. glass wool.

I claim:

1. Sound distributor with symmetry of revolution with respect to a fictitious axis (A) comprising at least one first sound source located on the said axis, said sound source having a front face and a rear face, the sound being emitted by the front face and being irradiated in directions adjacent to the said axis; a first and a second cup for reflecting the sounds emitted by the source, each cup having a symmetry of revolution about the said axis and having a convex outer surface and an inner surface defining an inner portion of the cup, so that the cup has a bottom and a large opening defined by an edge, the two cups being oriented in accordance with said axis and arranged tail to tail, so that their convex surfaces face one another and their bottoms are spaced by a predetermined distance, the bottom of the first cup having a small opening centered on the said axis, said first sound source being positioned facing said small opening of the first cup, so that its front face is located in the vicinity of said small opening of the first cup and its rear face is located in the inner portion of the first cup, the sound being irradiated towards the outer surface of the second cup and reflected away from said axis A by the outer surfaces of the two cups, characterized in that the bottom of the second cup has a small opening centered on said axis (A), the second cup having in its inner portion a first trumpet-shaped sound reflector trumpet having a first opening and a second opening which is smaller than the first opening, one edge of the first opening of the trumpet bearing on the edge of the second cup and one edge of the second opening of the trumpet bearing on the inner face of the second cup, in the vicinity of the small opening of the second cup, the trumpet having an inner face with a convex surface shape which is an exponential surface of revolution about said axis, the second cup also having a second cone-shaped reflector with a convex outer surface which is an exponential surface of revolution about the said axis, said cone having a base and an apex, the apex being directed towards the large opening of the second cup and the base being positioned facing the small opening of the second cup, set back from said small opening, in the inner portion of the second cup, so that the sounds emitted by the sound source are also reflected by the inner face of the trumpet and by the outer face of the cone and are radiated towards the large opening of the second cup.

2. Sound distributor according to claim 1, characterized in that it has a second sound source with a front face (31) and a rear face, the sound being emitted by the front face of said second source and being irradiated in directions adjacent to said axis, the second source being positioned facing the small opening of the second cup and being placed between the base of the cone and said small opening, so that the front face of the second source is located in the vicinity of the small opening of the second cup and the rear face is located in the inner portion of the second cup, the sounds of the second source being radiated towards the outer surface of the first cup and reflected away from said axis on the outer surfaces of the two cups, said sounds also being reflected by the inner face of the trumpet and by the outer face of the cone and are then radiated towards the large opening of the second cup.

3. Distributor according to either of the claims 1 and 2, characterized in that the two cups are made from a rigid, sound-reflecting material.

4. Distributor according to claim 2, characterized in that the first and second sound sources are of the electrodynamic type.

5. Distributor according to claim 4, characterized in that the outer surfaces of the two cups are convex exponential surfaces of revolution about the said axis (A).

6. A sound distributor with symmetry of revolution with respect to a fictitious axis A comprising, in combination, first and second cups mounted tail-to-tail and symmetrical about said axis, each said cup having a convex outer surface and being spaced apart longitudinally, at least one first sound source located on the axis and establishing sound radiation into the space between the two cups so as to have radiation in all directions in a plane perpendicular to said axis, said second cup having an inner face and a large opening directed away from said first cup, characterized in that the bottom of the second cup has a small opening centered on said axis, a first trumpet-shaped sound reflector trumpet in the second cup and having a large opening and a small opening, one edge of the large opening of the trumpet bearing on the edge of the second cup, and one edge of the small opening of the trumpet bearing on the inner face in the vicinity of the small opening of the second cup, the trumpet having an inner face with a convex surface shape which is an exponential surface of revolution about said axis, the second cup also having a pointed reflector with a convex outer surface which is an exponential surface of revolution about the said axis, said pointed reflector having a base and an apex with the base being positioned facing the small opening of the second cup, set back from said small opening, in the inner portion of the second cup, so that sounds emitted by the sound source are also reflected by the inner face of the trumpet and by the outer surface of the pointed reflector and radiated toward the large opening of the second cup.

7. A sound distributor according to claim 6, characterized in that a second sound source is mounted in the base of the pointed reflector with a front, sound emitting face facing the space between the two cups.

8. A sound distributor according to claim 6, characterized in that the two cups are made from a rigid, sound reflecting material.

9. A sound distributor according to claim 7, characterized in that the first and second sound source are of the electro-dynamic type.

10. A sound distributor according to claim 6, characterized in that the outer surfaces of the two cups are convex exponential surfaces of revolution about said axis.

11. A sound distributor according to claim 6, characterized in that said trumpet and said pointed reflector have convex surfaces made from a rigid sound absorbing material.

* * * * *

UNITED STATES PATENT AND TRADEMARK OFFICE

CERTIFICATE OF CORRECTION

PATENT NO. : 5,298,690

DATED : March 29, 1994

INVENTOR(S) : Siegfried Klein

It is certified that error appears in the above-indentified patent and that said Letters Patent is hereby corrected as shown below:

Column 1, line 63, "A" should be --A--;

Column 2, line 16, "this" should be --thus--;

Column 2, line 29, "disadvantages" should be --disadvantage--;

Column 3, line 63, "ledge" should be --edge--;

Column 4, line 45, "ledge" should be --edge--;

Column 4, line 53, "face, 31" should be --face 31,--;

Column 4, line 62, please delete "hose";

Column 5, line 41, after "distance" please insert --(d)--; and

Column 6, line 7, claim 2, please delete "(31)".

Signed and Sealed this

Thirteenth Day of September, 1994

Attest:

BRUCE LEHMAN

Attesting Officer

Commissioner of Patents and Trademarks

UNITED STATES PATENT AND TRADEMARK OFFICE

CERTIFICATE OF CORRECTION

PATENT NO. : 5,298,690

DATED : March 29, 1994

INVENTOR(S) : Siegfried Klein

It is certified that error appears in the above-indentified patent and that said Letters Patent is hereby corrected as shown below:

Column 4, line 59, after the second occurrence of "second" please insert --nose --.

Column 5, line 8, after the first occurrence of "the" please insert --nose --.

Signed and Sealed this

Eighteenth Day of October, 1994

Attest:

BRUCE LEHMAN

Attesting Officer

*Commissioner of Patents and Trademarks*